(12) United States Patent
Ding et al.

(10) Patent No.: US 6,551,855 B1
(45) Date of Patent: Apr. 22, 2003

(54) SUBSTRATE STRIP AND MANUFACTURING METHOD THEREOF

(75) Inventors: Yi Chuan Ding, Kaohsiung (TW); Kun Ching Chen, Tainan (TW); Yung I Yeh, Kaohsiung (TW)

(73) Assignee: Advanced Semiconductor Engineering, Inc. (TW)

( * ) Notice: Subject to any disclaimer, the term of this patent is extended or adjusted under 35 U.S.C. 154(b) by 0 days.

(21) Appl. No.: 09/987,319

(22) Filed: Nov. 14, 2001

(51) Int. Cl.[7] .................. H01L 21/44; H01L 21/48; H01L 21/50
(52) U.S. Cl. ........................ 438/106; 438/118
(58) Field of Search .................. 438/106, 107, 438/111, 118, 121, 123, 124, 126

(56) References Cited

U.S. PATENT DOCUMENTS

| | | | |
|---|---|---|---|
| 5,652,185 A | * | 7/1997 | Lee |
| 5,852,870 A | | 12/1998 | Freyman et al. ............ 29/841 |
| 6,020,218 A | * | 2/2000 | Shim et al. |
| 6,262,490 B1 | * | 7/2001 | Hsu et al. |
| 6,277,672 B1 | * | 8/2001 | Ho |
| 6,310,298 B1 | * | 10/2001 | Barrett et al. |

* cited by examiner

Primary Examiner—David Nelms
Assistant Examiner—Phuc T. Dang

(57) ABSTRACT

A substrate strip includes a plurality of substrate units wherein each of the substrate units is accepted for packaging a semiconductor package. The substrate strip comprises: a frame having at least one opening; at least one first substrate unit integrally formed with the strip frame; and at least one second substrate unit disposed in the opening and securely attached to the strip frame by an adhesive. The present invention further provides a method for making the substrate strip. The method is conducted by separating defected substrate units from a substrate strip and securely attaching accepted substrate units back to the substrate strip.

11 Claims, 4 Drawing Sheets

SUBSTRATE STRIP AND MANUFACTURING METHOD THEREOF

BACKGROUND OF THE INVENTION

1. Field of the Invention

This invention relates to a substrate strip for use in forming semiconductor packages, and more particularly to a substrate strip including a plurality of substrate units wherein each of the substrate units is accepted.

2. Description of the Related Art

As the ability to fabricate greater numbers of transistors on a given semiconductor chip size increases, the circuits on the chip become more complex and require a greater number of external electrical connections. To accommodate the required number of external contacts, semiconductor packages have evolved from lead frame based packages, such as dual-in-line ("DIPs") and quad-flat-pack ("QFP") packages, to laminated substrate based packages, such as ball grid arrays ("BGA").

FIG. 1 is a cross-sectional view of a conventional BGA package. As shown, the package comprises a laminated substrate 106 formed of, for example, a ceramic or plastic material such as epoxy-glass. Electrically conductive traces (not shown) are formed from conductive layers of the substrate 106. Methods for forming conductive traces are known in the art. For example, photo-lithographic techniques may be used to image a desired pattern into a photo-resist material disposed on a conductive layer of the substrate 106. The photoresist material is then "developed," i.e., the photoresist material not exposed by the image, is removed, thereby creating a corresponding pattern of exposed conductive material on the substrate. The exposed conductive material is then removed in an etching process. Finally, the remaining photoresist material is removed, leaving the desired pattern of conductive material on the substrate. Electrical connections between the layers are formed by conductive vias, such as via 114. Vias are formed in the substrate by known techniques, such as mechanical or laser drilling. After the via is created, it is plated with a conductive material to provide the desired electrical contact. A plurality of electrical contacts to the conductive traces of the package are provided on the lower surface of the package substrate 106.

The essential steps for manufacturing the package substrates are described above. Thereafter, a semiconductor chip 102 is mounted to the upper surface of the package substrate 106 by a suitable chip attach material 110, such as epoxy. Electrical connection between bond pads on the chip 102 and the conductive traces on the substrate 106 is provided by bond wires 104. Of course, in addition to the bond wires shown, different methods of providing electrical connections from the chip to the package are also well known in the art, such as, wire bonding or "flip-chip" techniques.

At last solder balls 108 are attached to each of the contacts to allow electrical connection between the semiconductor package and external electronic components, such as printed wire boards. Solder balls 108 are conventional and typically are constructed from a lead-tin alloy and are attached to the contacts by well known methods such as re-flow soldering. Of course, other conventional electrical connectors could be substituted for the solder balls 108, such as conductive pins attached to contacts on the lower surface of substrate 106.

All semiconductor packages must not only provide for a number of electrical connections to be made from bond pads on a semiconductor chip to external contacts on the package, but must also provide physical protection to prevent damage to the chip during handling. To protect the chip 102 and bond wires 104, a molded covering 112 is formed on the substrate 106. Generally, molded covering 112 is formed on the package by a molding process.

Currently, to facilitate simultaneous assembling of a number of packages, individual substrates are provided on a substrate strip which contains multiple substrate units which are later separated or "singulated", after the molding process. The substrate strip format helps to maximize productivity during assembly and also reduce material handling expense in other areas of the assembly process that operate on only site at a time.

One of the problems with procuring substrates in strip form is that the substrate vendor needs to provide 100% accepted units on the substrate strip so that the assembly facility does not process defected units. If the assembly facility accepts defected substrate units on each strip, then the throughput of certain assembly processes is reduced because defected units are being processed. Therefore, if the vendor fabricates substrate units in strip form and includes a certain number of defected units, all of the remaining accepted substrate units on the strip have to be thrown away. Accordingly, a method utilizes each of the accepted substrate unites produced by the substrate vendor and provides substrate strips with 100% accepted substrate units is needed.

SUMMARY OF THE INVENTION

It is a primary object of the present invention to provide a substrate strip including 100% accepted substrate units which improves the throughput of assembly process and minimizes the cost of assembly.

To achieve the above listed and other objects, the present invention provides a substrate strip characterized by including a plurality of substrate units integrally formed with a frame having at least one opening and at least one substrate unit deposed in the opening and adhered to the frame. All the substrate units on the substrate strip are accepted units for semiconductor assembly so that the assembly facility does not process "bad" units. Therefore, defected semiconductor packages are significantly reduced thereby raising the throughput of assembly process.

The present invention further provides a method for manufacturing the substrate strip. First, a substrate strip including a plurality of substrate units integrally formed with a frame is provided. There is at least one defected unit included in the substrate units. Next, the at least one defected unit is cut down from the substrate strip and at least one opening is formed in the substrate strip. Then, an accepted substrate unit cut from another weeding-out substrate strip is disposed in the opening of the substrate strip and secured to the frame by an adhesive. According to this method, the accepted substrate unit obtained from a weeding-out substrate strip is reused thereby reducing the manufacturing cost of the substrate manufacturer.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENT

Figure 1:
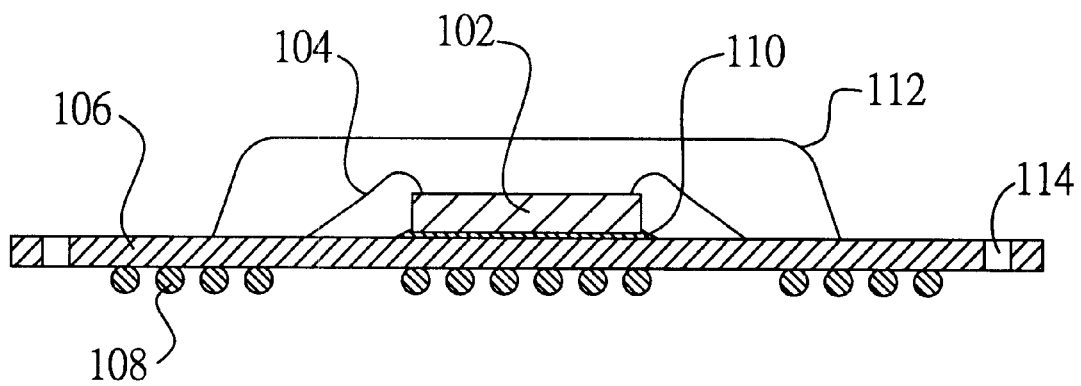
FIG. 1 is a cross-sectional view of a conventional ball grid array semiconductor package.
Figure 2:
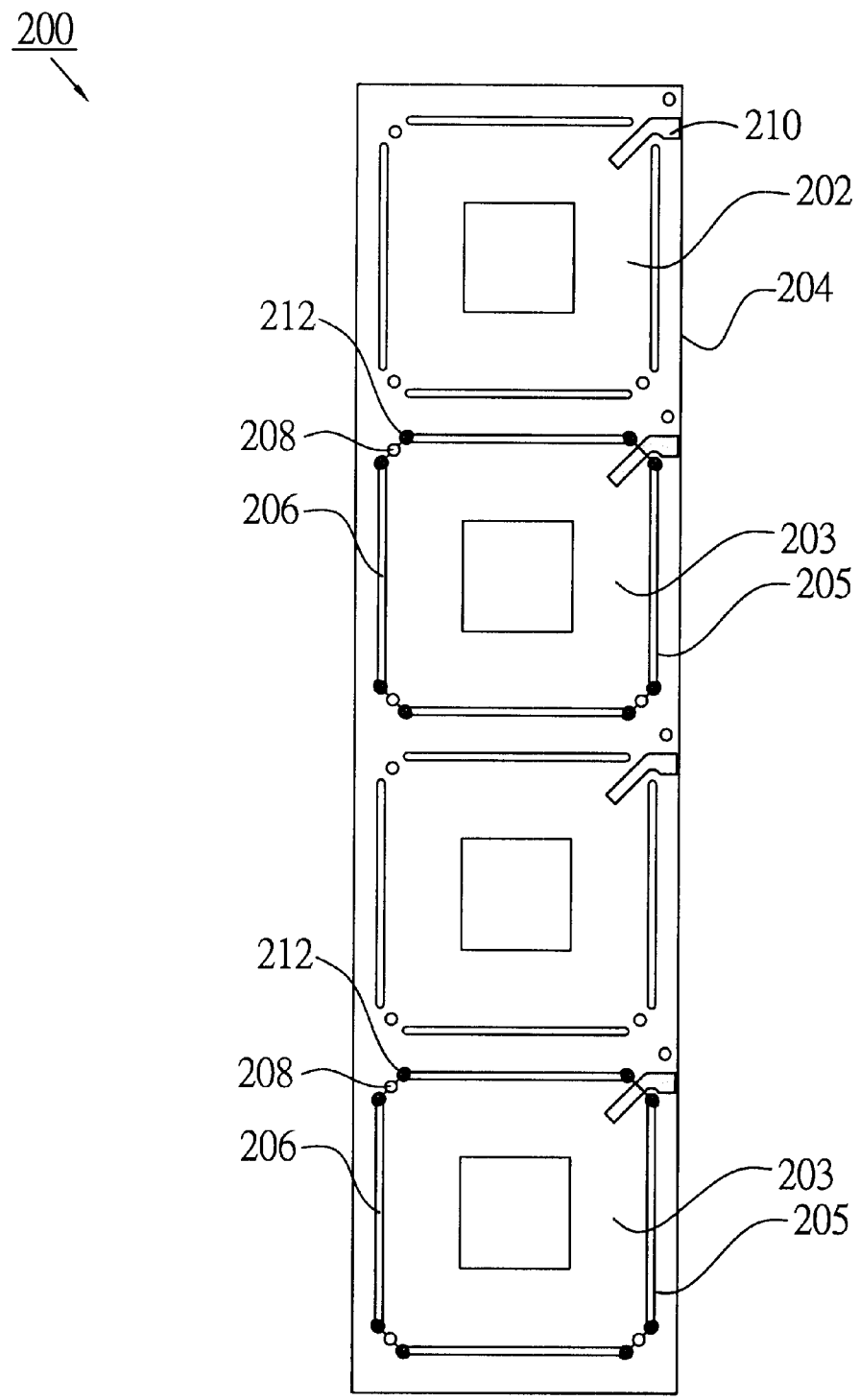
FIG. 2 is a top plan view of a substrate strip according to a preferred embodiment of the present invention.

FIG. 2 is a top view of a substrate strip 200 according to a preferred embodiment of the present invention. Substrate strip 200 contains two first substrates units 202 (for simplicity, only one first substrate unit is denoted by the number 202) integrally formed with a frame 204. The frame 204 has two opening 205 defined therein. Two second substrate units 203 are deposed in the openings 205 respectively and attached to the frame 204 by an adhesive 212. The substrate strip 200 preferably comprises a plurality of degating regions 210 (for simplicity, only one degating region is denoted by the number 210) extending from the edge of the frame 204 to a location inside the substrate units 202, 203. The degating regions 210 are located so that the edges of mold runners of a mold fit entirely within the degating regions 210 when the substrate strip 200 positioned in the mold during encapsulation of semiconductor chips. After encapsulating, encapsulant material in the mold runners and gates is formed on the degating regions 210. A layer of metal material which provides a weaker bonding to the encapsulant material covers the degating region 210 and facilitates removing the encapsulant material on the degating region. After the molding process, it is hard to remove the excess encapsulant from the degating region 210 contaminated by adhesive material. Therefore, the adhesive 212 which secures the second substrate units 203 to the frame 204 doesn't cover the entire degating region 210.

As shown in FIG. 2, the substrate strip 200 of the present invention preferably comprises a plurality of slots 206 surrounding the first and second substrate units 202, 203 so that only a portion of each substrate unit is connected to the frame 204. The slots 206 provide a stress relief for the substrate strip 200 to help control potential warping of the strip 200. The substrate strip 200 of the present invention is preferably a laminated substrate strip made of plastic material for assembling a plenty of semiconductor chip at the same time. The substrate strip 200 is preferably rectangle, and the substrate units on it are preferably ball grid array substrates.

Figure 3:
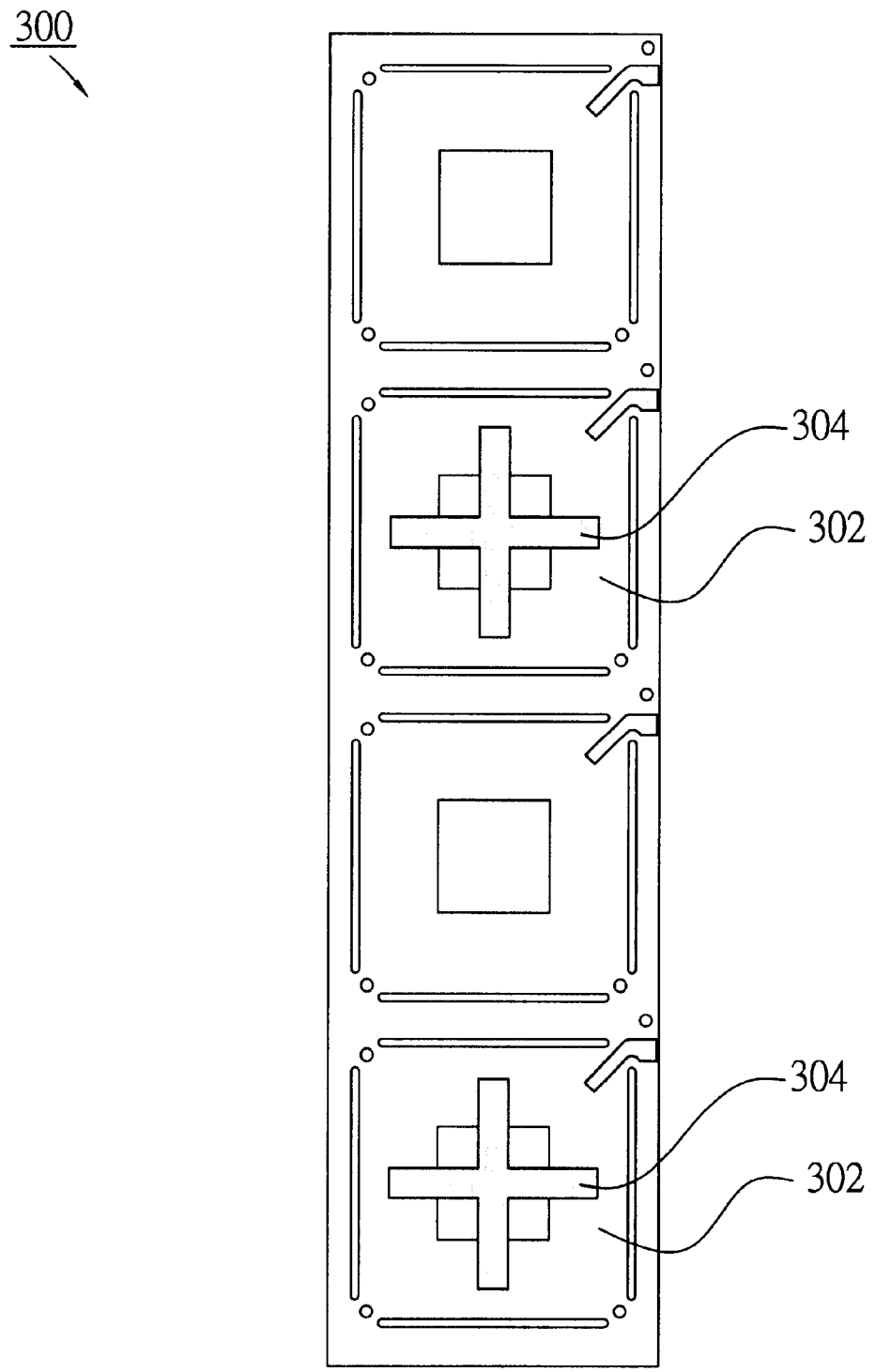
FIG. 3 is a top plan view of a substrate strip having two defected substrate units.
Figure 4:
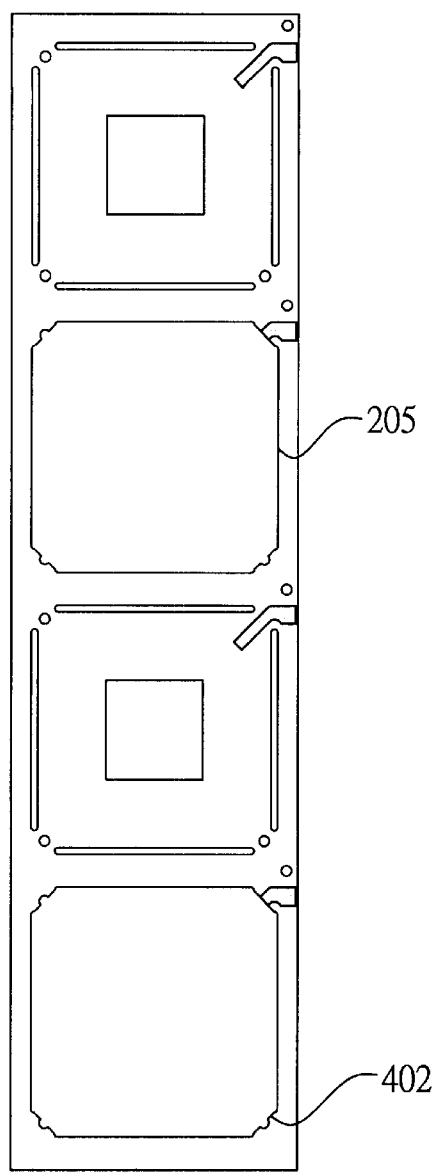
FIG. 4 is a top plan view of a substrate strip having two openings.

The method for manufacturing the substrate strip 200 includes the steps as below. As shown in FIG. 3, a substrate strip 300 which is produced by a conventional process is tested and found two defected substrate units 302 included therein. Then, each of the two defected substrate units is marked with a cross 304. Then the defected substrate units 302 are cut from the substrate strip 300, preferably by punching. It is noted that the substrate units of the present invention can be cut off by punching at the connecting portions between the substrate units and the frame 204 so that a plurality of cutting edges 402 (for simplicity, only one cutting edge is denoted by the number 402 in FIG. 4) are formed in the opening 205 of the frame 204 and a plurality of connecting edge 502 are formed on the punched substrate units at a location corresponding to the cutting edges (see FIG. 5). The substrate strip is preferably provided with a plurality of cutting holes 208 formed at the comer of the first and second substrate units 202 and 203. The cutting holes 208 help avoid rough edges at the comers of the substrate units when the substrate units are separated from the strip. In order to keep the consistence of the punched substrate units, it is preferable to cut across the cutting holes to obtain smooth and identical cutting edges 402 and connecting edges 502 so that the accepted substrate units can fit the openings 205 well.

Figure 5:
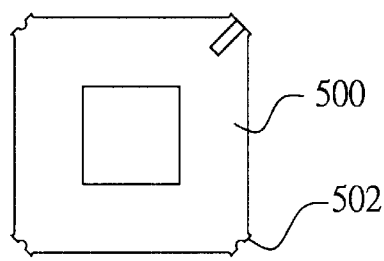
FIG. 5 is a top view of an accepted substrate unit.

After removing the defected substrate units 302 from the substrate strip 300, there are two openings 205 left. Two accepted substrate units 500 as shown in FIG. 5 are deposed in each of the openings 205, respectively. At last, the accepted substrate units are attached to the frame of the substrate strip by an adhesive 212. If the degating region 210 is contaminated by adhesive material, it is hard to remove the excess encapsulant therefrom. Therefore, the dispensing of the adhesive 212 should avoid covering the degating region 210. Preferably, the accepted substrate unit 500, as shown in FIG. 5, is cut from a weeding-out substrate strip in the same way as in the cutting of a defected substrate unit 302 from the substrate strip 300 so that the accepted substrate unit would have a shape and size substantially consistent with the defected substrate unit 302.

When the accepted substrate unit obtained by the method described above is placed into the opening 205 of the frame 204 of the substrate strip 200, since the shape and size of the accepted substrate unit 500 is substantially identical to the defected substrate unit 302, the single accepted substrate unit 500 fit the opening 205 well. Therefore, the connecting edges 502 of the accepted substrate unit 500 match the cutting edges 402 of the frame 204 well. Then an adhesive is applied to areas around interfaces between the substrate unit 500 and the strip 300 so as to attach the accepted substrate unit 500 to the substrate strip. In the cutting/attaching process, all of substrate units remain substantially consistent relative location so that an extra adjustment or alignment is unnecessary.

According to the preferred embodiments of the present invention, all of the substrate units of the substrate strip 200 are accepted substrate units so that the assembly facility does not process defected substrate units. The extra material and time for processing defected substrate unit are avoided. The present invention is particularly suitable for substrate-base semiconductor packages (e.g. ball grid array packages). The present invention minimizes the cost of the assembly process while the throughput of the semiconductor assembly is raised. Furthermore, the substrate vendor can keep the conventional way to manufacture the substrate strip and the remaining accepted substrate units in a substrate strip having defected units can be sufficiently utilized so that the manufacturing cost of the substrate manufacturer is reduced, too.

Although the invention has been explained in relation to its preferred embodiment, it is to be understood that many other possible modifications and variations can be made without departing from the spirit and scope of the invention as hereinafter claimed.

What is claimed is:

1. A substrate strip having a plurality of substrate units each adapted for packaging a semiconductor chip, the substrate strip comprising:

a frame having at least one opening and at least one first substrate unit integrally formed with the frame; and at least one second substrate unit disposed in the opening and securely attached to the frame by an adhesive.

2. The substrate strip as claimed in claim 1, further comprising a plurality of degating regions on a surface of the substrate strip at a location such that the edges of mold runners of a mold used to encapsulate the semiconductor chips in encapsulant material fit entirely within the degating regions when the substrate strip positioned in the mold during encapsulation of the semiconductor chips wherein the adhesive does not cover the degating region.

3. The substrate strip as claimed in claim 1, further comprising a plurality of slots separating each substrate unit from the frame such that only a portion of each substrate unit is connected to the frame.

4. The substrate strip as claimed in claim 1, wherein the substrate strip is a plastic substrate strip.

5. The substrate strip as claimed in claim 1, wherein each substrate unit is a ball grid array substrate.

6. A substrate strip having a plurality of substrate units each adapted to support a chip in a semiconductor chip package, the substrate strip comprising:

a frame having at least one opening, a region adapted to function as a first substrate unit, and a join portion disposed circumferentially of said region and connecting said region with a remainder of said frame, wherein said frame extends seamlessly and integrally from said remainder to said join portion to said first substrate unit; and a second substrate unit disposed in the opening and securely attached to the frame by an adhesive.

7. The substrate strip of claim 6, wherein said frame further comprises a plurality of slots arranged circumferentially of said first substrate unit, said join portion comprising a plurality of connecting bridges each formed between a pair of adjacent said slots, said connecting bridges connecting said first substrate unit to said remainder of said frame.

8. The substrate strip of claim 6, wherein said second substrate unit has a size and a shape such that said second substrate unit is completely disposed within said opening.

9. The substrate strip of claim 8, wherein an entire peripheral edge of said second substrate unit is either in contact with or inwardly spaced from an edge of said opening.

10. The substrate strip of claim 9, wherein said adhesive is disposed between the edges of said second substrate unit and said opening.

11. The substrate strip of claim 6, wherein a layer of metal is coated on a major surface of said substrate strip to define a plurality of degating regions each extending from an outer edge of said frame into a location inside one of said substrate units, wherein the degating region corresponding to said second substrate unit spans over an outer edge of said second opening.

* * * * *